(12) United States Patent
Bedarida et al.

(10) Patent No.: US 7,920,436 B2
(45) Date of Patent: Apr. 5, 2011

(54) SENSE AMPLIFIER

(75) Inventors: Lorenzo Bedarida, Vimercate (IT); Simone Bartoli, Cambiago (IT); Davide Manfre, Pandino (IT); Alex Pojer, Milan (IT)

(73) Assignee: Atmel Corporation, San Jose, CA (US)

( * ) Notice: Subject to any disclaimer, the term of this patent is extended or adjusted under 35 U.S.C. 154(b) by 171 days.

(21) Appl. No.: 12/336,965

(22) Filed: Dec. 17, 2008

(65) Prior Publication Data
US 2010/0149896 A1    Jun. 17, 2010

(51) Int. Cl.
*G11C 7/00* (2006.01)
(52) U.S. Cl. .......................... 365/205; 365/207; 327/51
(58) Field of Classification Search .................. 365/205, 365/207; 327/51
See application file for complete search history.

(56) References Cited

U.S. PATENT DOCUMENTS 7,126,869 B1 * 10/2006 Chou ............................ 365/207
7,477,559 B2 * 1/2009 Taddeo ........................ 365/205

\* cited by examiner

*Primary Examiner* — Son Dinh
*Assistant Examiner* — Nam T Nguyen
(74) *Attorney, Agent, or Firm* — Schwegman, Lundberg & Woessner, P.A.

(57) ABSTRACT

A sense amplifier includes a first cascode transistor, a second cascode transistor, a first feedback circuit, a second feedback circuit, and a comparator. The drain of the first cascode transistor is connected directly to a first voltage source. The gate of the first cascode transistor is connected to the first feedback circuit and a first input of the comparator, and the source of the first cascode transistor is connected to the first feedback circuit and a first column decoder. The drain of the second cascode transistor is connected directly to a second voltage source. The gate of the second cascode transistor is connected to the second feedback circuit and a second input of the comparator, and the source of the second cascode transistor is connected to the second feedback circuit and a second column decoder.

6 Claims, 5 Drawing Sheets

SENSE AMPLIFIER

FIELD OF INVENTION

The present invention is related to a sense amplifier with an extended low voltage range supply.

BACKGROUND

In order to correctly read a data item from a memory cell of a memory matrix, a current read from a memory matrix cell may be compared to a current read from a reference matrix cell, which may be different matrices. In this manner, the difference between a programmed cell and an erased cell may be detected. In addition, rather than using a reference cell current, several kinds of current generators could be also used in place of them.

For this reason, memory matrices may be configured so that a reading of the data item from a memory cell is obtained by comparing a current that flows across a reference matrix cell with a current of a selected cell. In the current state of the art, this may be accomplished by the use of "mirror sensing" where Pchannel transistors operate in a mirror and diode configuration. Pchannel transistors must be able to furnish a very high current to quickly precharge a large capacitance and need to have a large length in order to minimize possible mirror error. Accordingly, Pchannel transistors have a large width and length, which causes them to take up a large surface area on a circuit.

Due to the large lengths (L) and widths (W), Pchannel transistors have a high capacitance load. Therefore, after the precharge phase, when they are required to sink a very low current, (e.g., the flash cell current that is in the range of uA), they are already near their turning off point, and their large capacitance load in this state must be moved by a low current. The large size of the Pchannel transistors is required to sink a high current to quickly precharge the bitline capacitance. Additionally, they are not effective for low current. Using a Pchannel transistor, or diode configuration, to precharge a node has an additional drawback in that the last precharge phase is very slow because as the voltage of the node increases, which is also the voltage in the gate to the Pchannel transistor, the transistor current is decreasing.

SUMMARY

A sense amplifier is disclosed to facilitate the reading of a data item from a memory cell of a memory matrix. The sense amplifier comprises a first cascode transistor, a second cascode transistor, a first feedback circuit, a second feedback circuit, and a comparator. The drain of the first cascode transistor is connected directly to a first voltage source. The gate of the first cascode transistor is connected to the first feedback circuit and a first input of the comparator, and the source of the first cascode transistor is connected to the first feedback circuit and a first column decoder. The drain of the second cascode transistor is connected directly to a second voltage source. The gate of the second cascode transistor is connected to the second feedback circuit and a second input of the comparator, and the source of the second cascode transistor is connected to the second feedback circuit and a second column decoder.

BRIEF DESCRIPTION OF THE DRAWINGS

A more detailed understanding of the invention may be had from the following description, given by way of example and to be understood in conjunction with the accompanying drawings wherein.

DETAILED DESCRIPTION OF EXAMPLE EMBODIMENTS

Embodiments of the present invention will be described with reference to the figures wherein like numerals represent like elements throughout.

The Sense Amplifier

Figure 1:
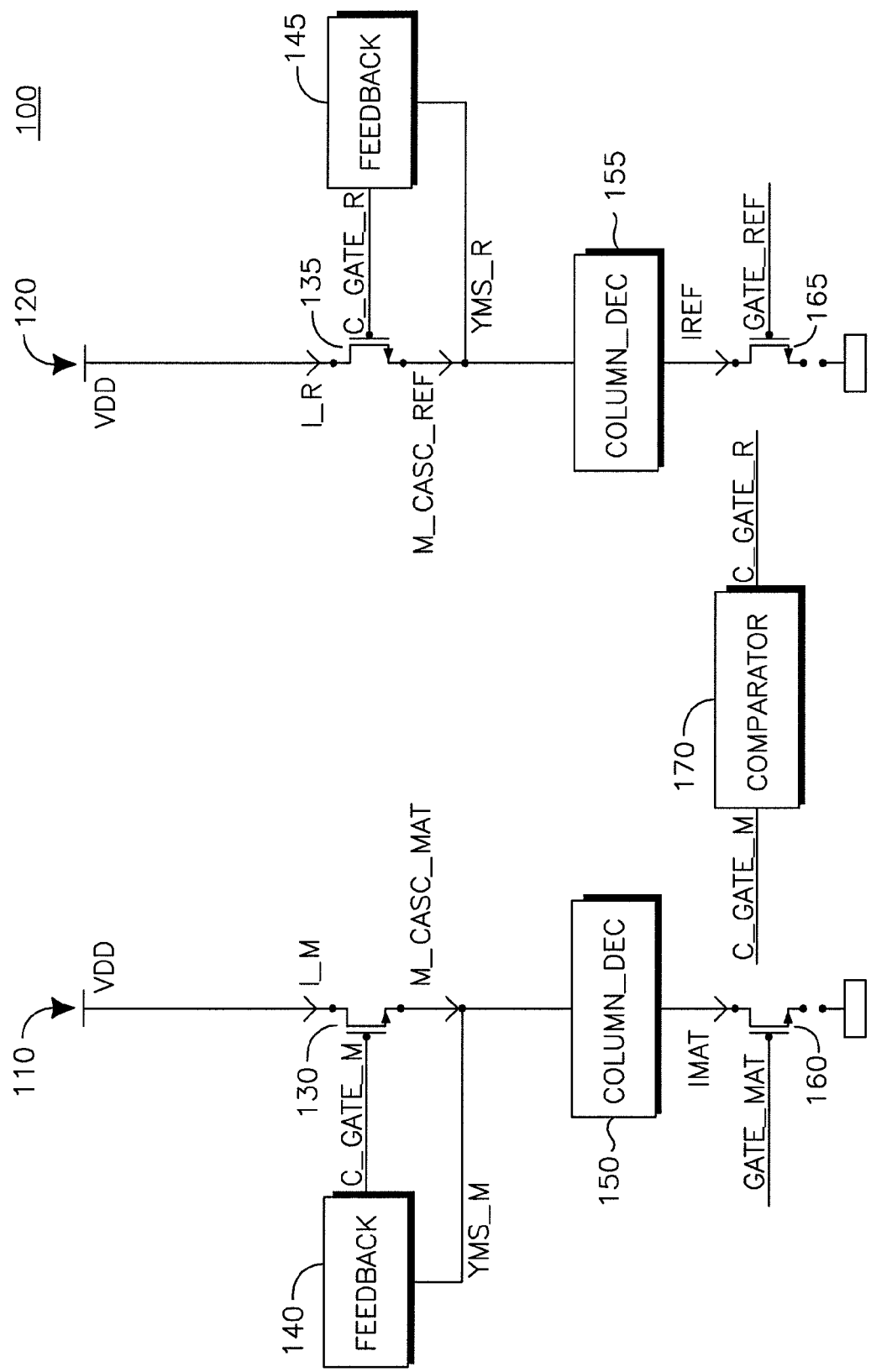
FIG. 1 is a block diagram of a sense amplifier in accordance with an embodiment of the invention.

In accordance with an embodiment of the invention, FIG. 1 is a block diagram of a sense amplifier 100. In this example, the first voltage source connected to the drain of the first cascode and the second voltage source connected to the drain of the second cascode are both the supply voltage VDD. The sense amplifier 100 includes a first part, the matrix part 110 and a second part, the reference part 120. The first part 110 includes the supply VDD, a cascode transistor (M_CASC_MAT) 130, a feedback 140, a column decoder 150, and a flash cell 160, whose gate is GATE_MAT. The second part 120 includes, supply VDD, a cascode transistor (M_CASC_REF) 135, a feedback 145, a column decoder 155, and a reference flash cell 165 whose gate is GATE_REF. The sense amplifier 100 also includes a comparator 170. The matrix and the reference parts in this example are present together but it should be noted that they could also be separate.

The cascode transistors M_CASC_MAT 130 and M_CASC_REF 135, by way of their respective feedback circuitry, define the values of the YMS_M and YMS_R voltages, respectively.

In this example, YMS_M is connected by the column decoder 150 to the bitline, (i.e., drain), of the flash cell 160 inside the matrix to be read. YMS_R is connected by the column decoder 155 to the bitline of the flash reference cell 165. If the selected flash current, (i.e., the matrix flash cell of which the status is being read), sinks a current value higher than the flash reference cell, then the status of the selected flash cell is detected as a one (1). Otherwise, the status of the selected flash cell is detected as a zero (0).

Feedback circuitry may be designed so that YMS_M and YMS_R each have a voltage value ideally of about 1V or less, which may be referred to as VD. Accordingly, feedback circuitry defines, respectively, the voltage values of the gates of cascode transistor M_CASC_MAT (C_GATE_M) 130 and cascode transistor M_CASC_REF (C_GATE_R) 135.

Due to the fact that the C_GATE_M and C_GATE_R have to change their value according to how much the respective selected flash cell current and reference cell current sink, these nodes may be utilized as inputs of a comparator, (e.g., comparator 170), to define if a one or a zero is read. In a conventional sense amplifier, cascode transistors are used to limit the maximum voltage of the YMS node, thereby limiting the maximum voltage of the drain of the selected flash cell connected to it. In the present example, the cascode transistors are also utilized to get the info of the matrix flash cell status using their gates as the inputs into comparator 170, eliminating the need for large Pchannel transistors in a mirror configuration to perform this function.

The M_CASC_MAT transistor 130 sinks a current (I_M). The source node YMS_M of the M_CASC_MAT transistor 130 is connected to the column decoder 150 and there through to the drain of the selected cell, (i.e., the flash cell of the matrix to be read). In order to select it, column and a row decoder (not shown) may be used. In addition, the source node YMS_M of the M_CASC_MAT transistor 130 is connected to the feedback 140. The selected flash cell 160 statically sinks a current IMAT. In addition, the gate of the M_CASC_MAT transistor 130 (C_GATE_M) is connected directly to the comparator 170.

The M_CASC_REF transistor 135 sinks a current (I_R). The source node YMS_R of the M_CASC_REF transistor 135 is connected to the column decoder 155 and there through to the drain of the reference cell. In addition, the source node YMS_R of the M_CASC_REF transistor 135 is connected to the feedback 145. The flash reference cell of the sense 165 statically sinks a current IREF. In addition, the gate of the M_CASC_REF transistor 135 (C_GATE_R) is connected directly to the comparator 170.

Since the cascode transistors (M_CASC_MAT transistor 130 and M_CASC_REF transistor 135) may operate in a saturation region, their gates satisfy a relationship in accordance with the first order equation of a conventional MOS transistor, as shown in the following equation:

$$Id = K*W/L*(VGS-VTHn)^2, \quad \text{Equation (1)}$$

where W is the width, L is the length, and K is a typical process parameter of the transistor. VGS is the difference voltage between the voltage of the source node YMS_M or YMS_R, and the gate voltage of the transistor, and VTHn is the Nchannel threshold of the Nchannel transistors M_CASC_MAT and M_CASC_REF.

The voltages (VGS and VTHn) in Equation (1) above are for the cascode M_CASC_MAT, respectively: (VGS), the difference between the voltage of its gate C_GATE_M and of its source YMS_M that is connected by the column decoder 150 to the bitline of the selected flash cell and the voltage threshold (VTHn) of N transistor M_CASC_MAT. The voltages for the cascode M_CASC_REF 135 are respectively: (VGS), the difference between the voltage of its gate C_GATE_R and of its source YMS_R that is connected to the drain of the flash reference cell by the column decoder 155 and the voltage threshold (VTHn) of N transistor M_CASC_REF.

In a conventional memory device, the array of the cells, (i.e., the matrix), is organized in rows and columns, where the selected row and the selected column define selected matrix cells to be read. Many cells belong to a row, and they are connected to the row by their respective gates. Additionally, many cells belong to a column, and they are connected to their respective column by their drains. A column may be connected to drains of many different cells, and accordingly may have a high capacitance.

Under static conditions, the current I_M of M_CASC_MAT 130 is equal to IMAT, and I_R of M_CASC_REF 135 is equal to IREF. Assuming that the voltage of YMS_M is VD, (i.e., the ideal node voltage for YMS_M and YMS_R), under static conditions where the transient phase has ended and capacitive current is equal to zero, then:

$$I\_M = IMAT = K*W/L*(V(C\_GATE\_M)-VD-VTHN)^2. \quad \text{Equation (2)}$$

Likewise, assuming that the voltage of YMS_R is VD under static conditions, then:

$$I\_R = IREF = K*W/L*(V(C\_GATE\_R)-VD-VTHN)^2. \quad \text{Equation (3)}$$

Accordingly, the gate of the cascode transistors, e.g., 130 and 135, if biased in the saturation region, the gates of the cascode transistors may be utilized as inputs (gates) to the comparator 170. Accordingly, as shown in FIG. 1, the gates C_GATE_M and C_GATE_R are inputs to the comparator 170.

The drains of M_CASC_MAT 130 and M_CASC_REF 135 are connected directly to the supply VDD.

An Alternative Sense Amplifier

Figure 2:
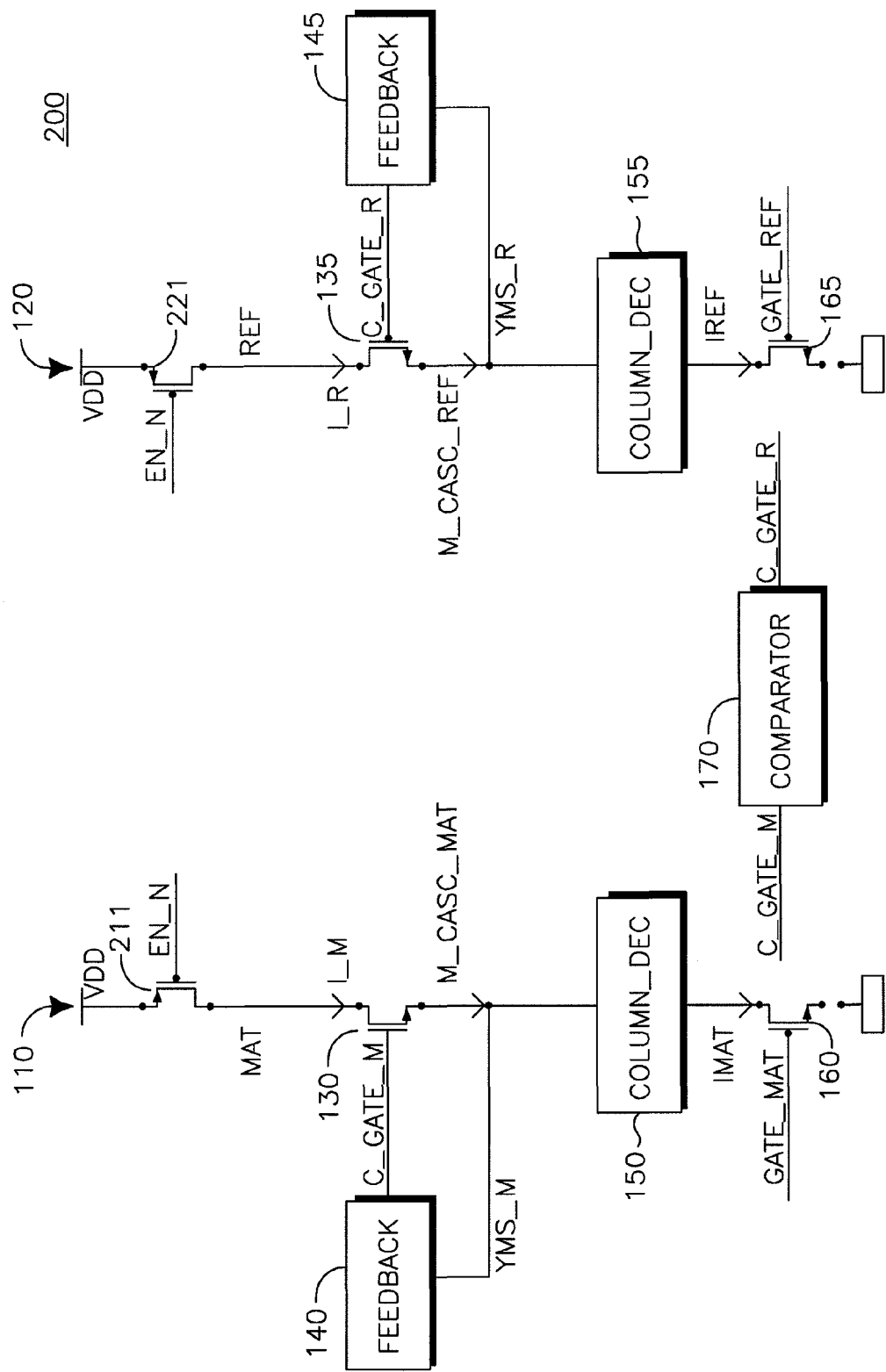
FIG. 2 is a block diagram of a sense amplifier in accordance with an alternative embodiment of the invention.

FIG. 2 is a block diagram of a sense amplifier 200 in accordance with an alternative embodiment of the invention. The sense amplifier 200 is substantially similar to the sense amplifier 100 of FIG. 1. However, in addition to the components of the sense amplifier 100, the first part, the matrix part, 110 includes a enabling pchannel transistor 211, and the second part, the reference part, 220 includes an enabling pchannel transistor 221.

In this configuration, the M_CASC_MAT transistor 230 sinks a current (I_M) through the pchannel transistor 211, whose gate is connected to EN_N. The M_CASC_REF transistor 235 sinks a current (I_R) through the pchannel transistor 221, whose gate is connected to EN_N.

In this way, the drains of the cascode transistors of FIG. 2 are connected to the supply VDD through the enabling pchannel transistors 211 and 221, which are able to sink a very high current to precharge the bitline. Conventionally, Pchannel transistors are utilized in a diode/mirror configuration to charge the bitline and therefore limit maximum current. Accordingly, in the present embodiment, the enabling pchannel transistors 211 and 221 may have a minimum length, not be in a diode/mirror configuration and can furnish the same high precharge current of a diode pchannel configuration in the current art with a very smaller area. Accordingly, in the embodiments of FIGS. 1 and 2, the input nodes of the comparator 170 of the sense amplifiers 100 and 200 are C_GATE_R and C_GATE_M, (i.e., the gates of the cascode transistors), as opposed to the high capacitance MAT and REF nodes of the prior art Pchannel diode configuration (not shown).

In accordance with Equation (1), if IMAT is greater than IREF, and the voltages of nodes YMS_R and YMS_M are ideally VD, then the voltage of the cascode gate C_GATE_M is greater than the voltage of the cascode gate C_GATE_R. Conversely, if IREF is greater than IMAT, then the voltage of the cascode gate C_GATE_R is greater than the voltage of the cascode gate C_GATE_M.

Only the equation VDD>VD+VHTN has to be satisfied if the supply voltage of the feedback circuitry is VDD. Accordingly, the sense amplifiers 100 and 200 are capable of operating at a lower supply voltage than those having a pchannel diode configuration. The minimum supply range value in the standard approach is already limited, even without considering the value of VD by both the Pchannel threshold and the Nchannel threshold. Accordingly, the sense amplifier may be limited only by the Nchannel threshold, which could be very low in several processes.

In the configuration of sense amplifiers 100 and 200, the reference current IREF is the flash cell reference current of the sense amplifier in accordance with an embodiment. However, a global node V_R may also be utilized in each comparator for a number 'N' of sense amplifiers.

Global Node Reference Current Circuit Sense Amplifier

Figure 3:
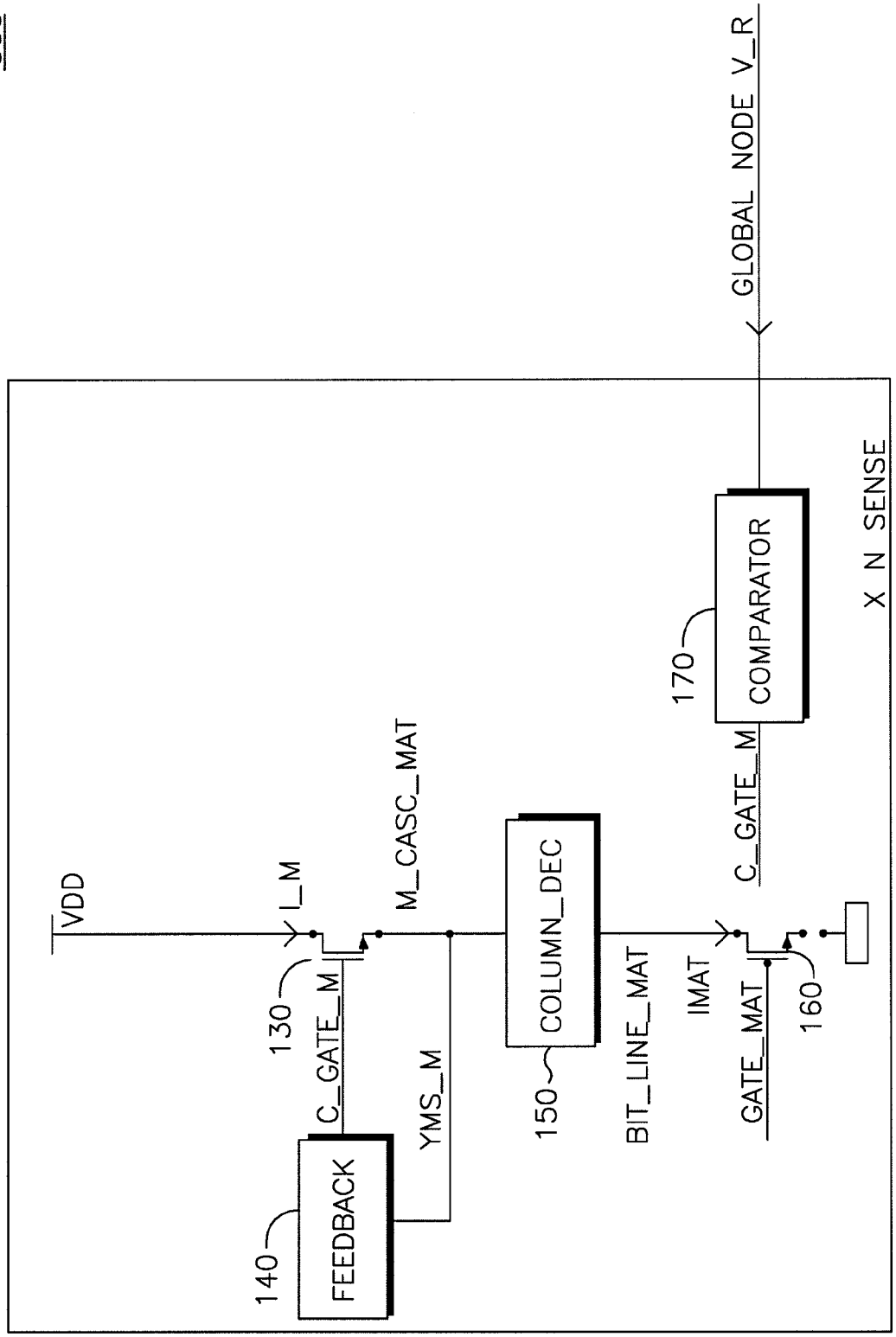
FIG. 3 is a block diagram of a global node reference circuit sense amplifier in accordance with another alternative embodiment of the invention.

FIG. 3 is a block diagram of a global node reference circuit sense amplifier 300 in accordance with another alternative embodiment of the invention. The amplifier 300 is substantially similar to the matrix part 110 of FIG. 1. For purposes of example, only one sense amplifier 300 is depicted. However, it is to be understood that a plurality 'N' of amplifiers may be utilized. Accordingly, shown in FIG. 3 is the amplifier 300×N sense amplifiers.

In this embodiment, a conventional global node V_R reference voltage is connected to the comparator 370 in place of the C_GATE_R of the cascode reference transistors depicted in FIGS. 1 and 2.

EXAMPLE COMPARATOR

Figure 4:
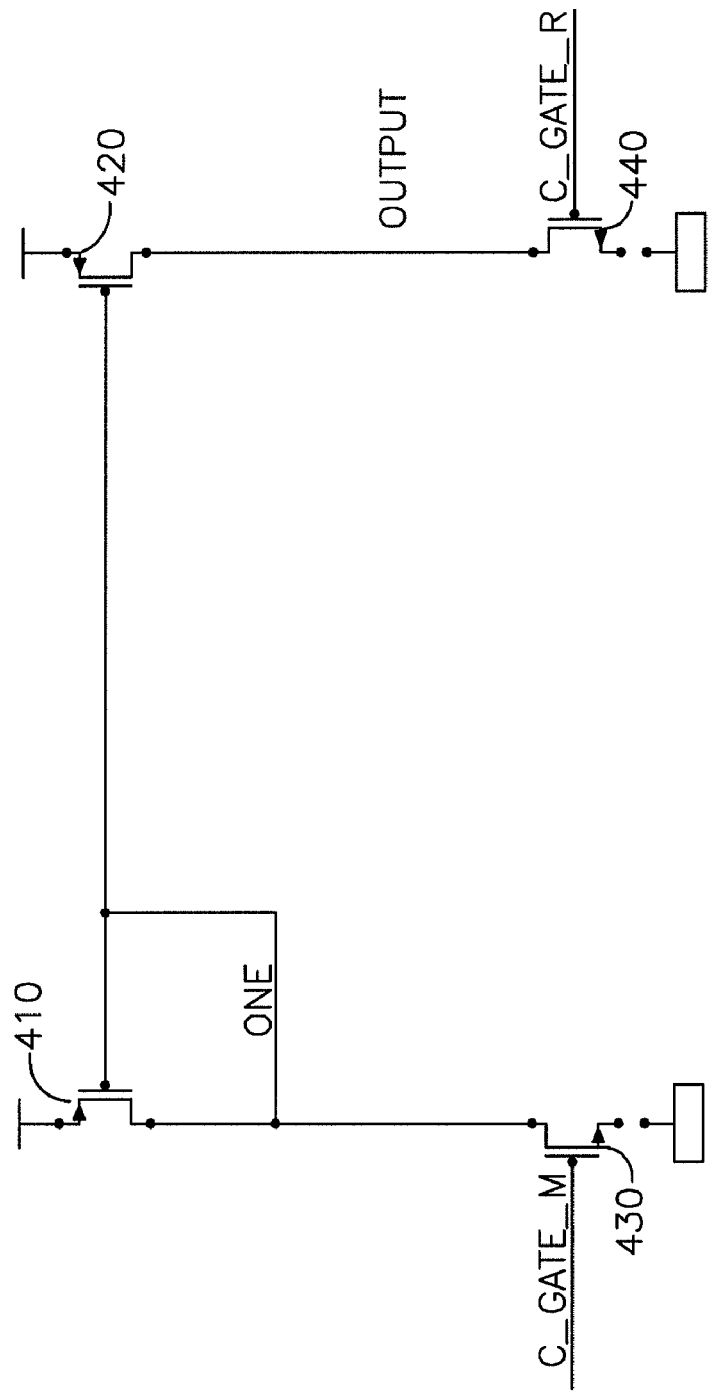
FIG. 4 is a block diagram of an example comparator.

FIG. 4 is a block diagram of an example of a comparator 400. The comparator 400 includes a first transistor 410, a second transistor 420, a third transistor 430 and a fourth transistor 440. The gates of the first and second transistors 410 and 420 are connected together and to the drain of the third transistor 430. The gate of the third transistor 430 is connected to C_GATE_M, for example, the gate of M_CASC_MAT cascode transistors of FIGS. 1 and 2. The gate of the fourth transistor 440 is connected to C_GATE_R, for example the gate of M_CASC_REF cascode transistors of FIGS. 1 and 2. The drain of the second transistor 420 is connected to the drain of the fourth transistor 440, and is also the output of the comparator 400.

If the selected flash cell current IMAT is higher of the flash reference cell one IREF, (i.e., the flash cell status is one), then the voltage of the gate C_GATE_M of the cascode transistor M_CASC_MAT 130 will be higher than the voltage value of the gate C_GATE_R of the cascode transistor M_CASC_REF 135. Accordingly, the transistor 430 sinks a current higher than current sunk by transistor 440. The current sunk by transistor 430 is mirrored by the transistor 410 to the transistor 420, so that on the node flow the current mirrored by transistor 420 that is equal to the current of transistor 430, and the current sunk by transistor 440. The first current is higher and the OUTPUT node then rises. Otherwise if the selected cell current is lower than flash reference one (flash cell status is zero) then the OUTPUT node current falls.

Alternative Comparator

Figure 5:
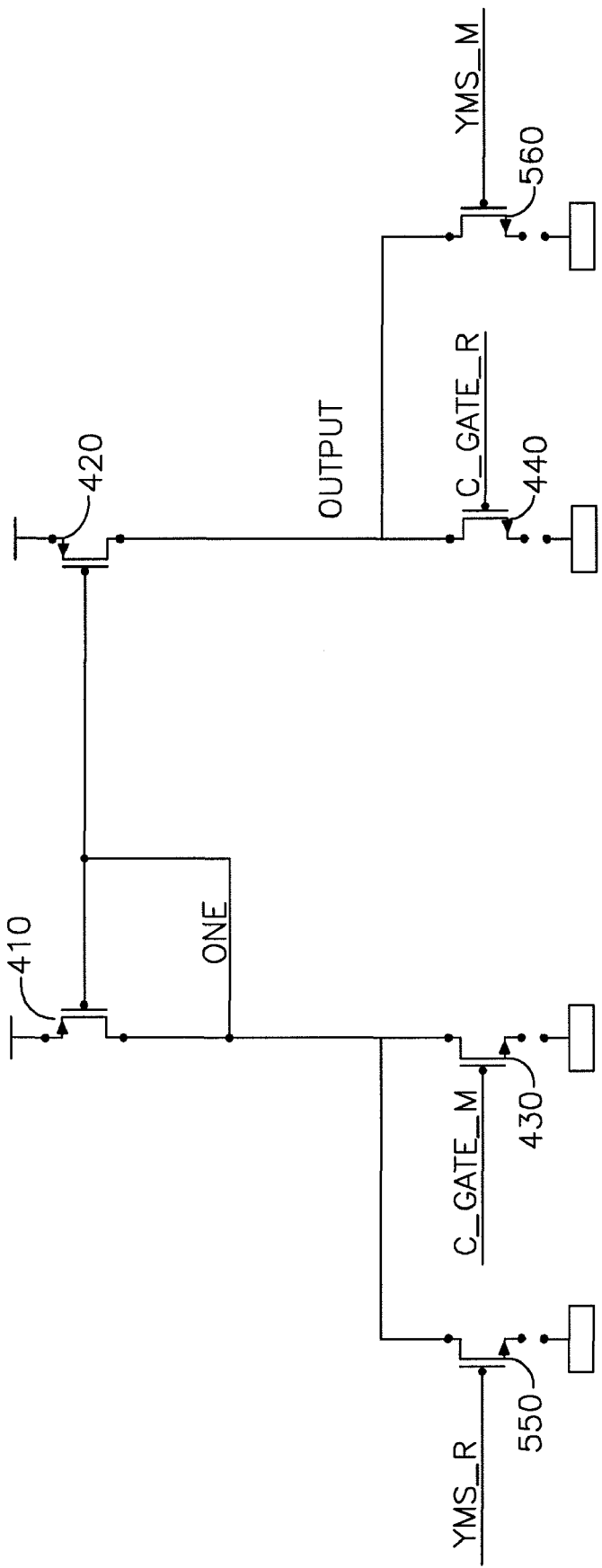
FIG. 5 is an example schematic diagram of a comparator in accordance with an alternative embodiment of the invention.

FIG. 5 is an example schematic diagram of a comparator 500 in accordance with an alternative embodiment of the invention. The comparator 500 is substantially similar to the comparator 400 of FIG. 4. However, in addition, there are included a fifth transistor 550 and a sixth transistor 560.

Ideally, the feedback circuitry, (e.g., feedbacks 140, 145, and the like), forces the voltage of the YMS node and therefore of the flash drain cell to a fixed value of VD. However, in some cases, a small difference of YMS voltage as a function of current may exist. In this case, when IMAT is greater than IREF, the YMS_M voltage may be slightly less than the YMS_R voltage, and the C_GATE_M voltage may be still greater than the C_GATE_R voltage, but with a reduced delta with respect ideal case. The opposite may occur if IREF is greater than IMAT. Accordingly, the YMS_R and YMS_M may be provided to the comparator to compensate for non-ideal feedback.

The drain of the fifth transistor 550 is connected to the drain of the third transistor 430, but the gate of the fifth transistor 550 is connected to YMS_R. The drain of the sixth transistor 560 is connected to the drain of the fourth transistor 440, but the gate is connected to YMS_M.

Although the features and elements of the present invention are described in the example embodiments in particular combinations, each feature or element can be used alone without the other features and elements of the example embodiments or in various combinations with or without other features and elements of the present invention. The present invention may be implemented in a processor, and/or any general purpose computer for use with or by any non-volatile/volatile memory device. Suitable processors include, by way of example, both general and special purpose processors. Embodiments of the present invention may be utilized where a sense amplifier is used, such as in various kinds of memory, (e.g., ROM, RAM, EPROM, flash memory, and the like).

Typically, a processor will receive instructions and data from a read only memory (ROM), a RAM, and/or a storage device having stored software or firmware. Storage devices suitable for embodying computer program instructions and data include all forms of non-volatile memory, including by way of example semiconductor memory devices, read only memories (ROMs), magnetic media such as internal hard disks and removable disks, magneto-optical media, and optical media such as CD-ROM disks and digital versatile disks (DVDs). Types of hardware components, processors, or machines which may be used by or in conjunction with the present invention include Application Specific Integrated Circuits (ASICs), Field Programmable Gate Arrays (FPGAs), microprocessors, or any integrated circuit.

What is claimed is:

1. A sense amplifier, comprising:
a first cascode transistor;
a second cascode transistor;
a first feedback circuit;
a second feedback circuit; and
a comparator;
wherein the drain of the first cascode transistor is connected to a first voltage source, the gate of the first cascode transistor is connected to the first feedback circuit and a first input of the comparator, and the source of the first cascode transistor is connected to the first feedback circuit and a first column decoder;
wherein the drain of the second cascode transistor is connected to a second voltage source, the gate of the second cascode transistor is connected to the second feedback circuit and a second input of the comparator, and the source of the second cascode transistor is connected to the second feedback circuit and a second column decoder
a first enabling transistor and a second enabling transistor,
wherein the source of the first enabling transistor is connected to the first voltage, the gate is connected to an enabling voltage, and the drain is connected to the drain of the first cascode transistor, and
wherein the source of the second enabling transistor is connected to the second voltage, the gate is connected to the enabling voltage, and the drain is connected to the drain of the second cascode transistor.

2. The sense amplifier of claim 1 wherein the second voltage source is a supply voltage.

3. The sense amplifier of claim 1 wherein the first voltage source is a supply voltage.

4. A comparator comprising:
a first transistor;
a second transistor; a third transistor; and
a fourth transistor;
wherein the drain of the third transistor is connected to the drain of the first transistor and to the gates of the first and second transistors, and the gate of the third transistor is connected to the gate of a first cascode transistor; and
wherein the drain of the fourth transistor is connected to the drain of the second transistor, and the gate of the fourth transistor is connected to the gate of a second cascode transistor.

5. The comparator of claim 4 wherein the drain of the second transistor of the comparator generates an output of the comparator.

6. The comparator of claim 4, further comprising a fifth transistor and a sixth transistor, wherein the drain of the fifth transistor is connected to the drain of the third transistor, and the gate of the fifth transistor is connected to the source of the second cascode transistor, and wherein the drain of the sixth transistor is connected to the drain of the fourth transistor and gate of the sixth transistor is connected to the source of the first cascode transistor.

* * * * *

UNITED STATES PATENT AND TRADEMARK OFFICE
CERTIFICATE OF CORRECTION

PATENT NO. : 7,920,436 B2
APPLICATION NO. : 12/336965
DATED : April 5, 2011
INVENTOR(S) : Lorenzo Bedarida et al.

It is certified that error appears in the above-identified patent and that said Letters Patent is hereby corrected as shown below:

In the Specification

Column 3, Line 60:

Delete: " $I\_M=IMAT=K*W/L*(V(C\_GATE\_M)-VD-VTHN)^2$ ."

Insert: -- $I\_M=IMAT=K*W/L*(V(C\_GATE\_M)-VD-VTHN)^2$ . --.

Column 6, Line 38: delete "cascade" and insert --cascode--.

In the Claims

Column 6, Claim 4, Line 58: after "a second transistor;" insert a page return.

Line 58 and new lines 59-60 should read:    "a second transistor;
                                             a third transistor; and
                                             a fourth transistor;".

Signed and Sealed this
First Day of April, 2014

Michelle K. Lee
*Deputy Director of the United States Patent and Trademark Office*